(12) United States Patent
Steinhoff

(10) Patent No.: US 6,949,800 B2
(45) Date of Patent: Sep. 27, 2005

(54) VERSATILE SYSTEM FOR ELECTROSTATIC DISCHARGE PROTECTION UTILIZING SILICON CONTROLLED RECTIFIER

(75) Inventor: Robert M. Steinhoff, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/692,606

(22) Filed: Oct. 24, 2003

(65) Prior Publication Data
US 2005/0087761 A1 Apr. 28, 2005

(51) Int. Cl.$^7$ .......................... H01L 23/62; H01L 29/00
(52) U.S. Cl. ........................................ 257/355; 257/536
(58) Field of Search .............................. 257/355–356, 257/530–536

(56) References Cited

U.S. PATENT DOCUMENTS 6,671,153 B1 * 12/2003 Ker et al. .................... 361/111

* cited by examiner

Primary Examiner—Cuong Nguyen
(74) Attorney, Agent, or Firm—Rose Alyssa Keagy; W. James Brady, III; Frederick J. Telecky, Jr.

(57) ABSTRACT

The present invention provides a system for electrostatic discharge protection in a semiconductor device, utilizing a silicon-controlled rectifier (502). The system includes the silicon controlled rectifier, which has a first p-type region (508) coupled to a voltage node (504), a first n-type region (512) having a first side adjoining the first p-type region, a second p-type region (510) having a first side adjoining a second side of the first n-type region, and a second n-type region (514) having a first side adjoining a second side of the second p-type region. A clamping structure (506) is intercoupled between the second n-type region and ground, to prevent the junction between the second p-type region and the second n-type region from retaining a forward bias. A switching structure (518) is intercoupled between the second p-type region and ground to ground the second p-type region during normal operation of the semiconductor device.

13 Claims, 3 Drawing Sheets

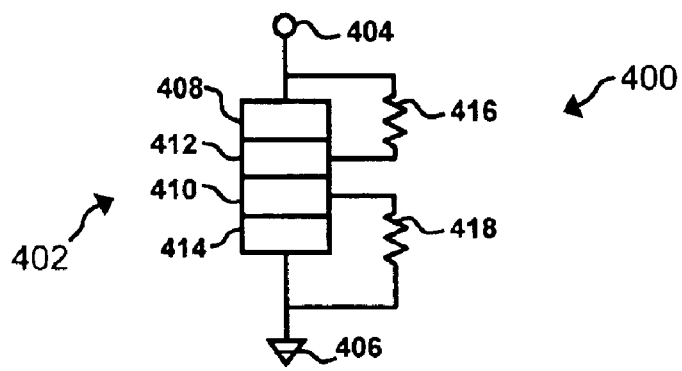
FIG. 4 (*Prior Art*)
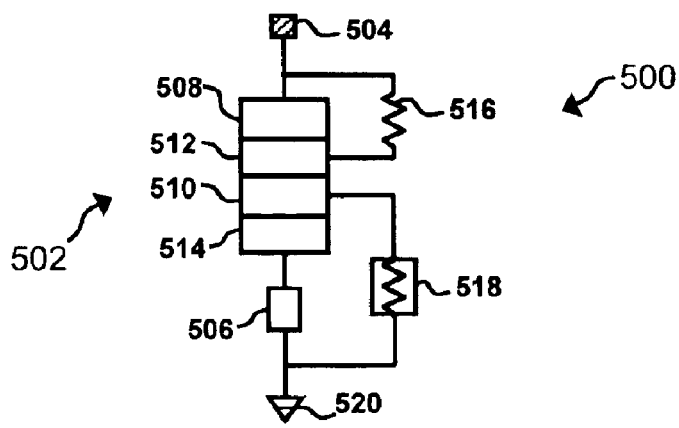
FIG. 5
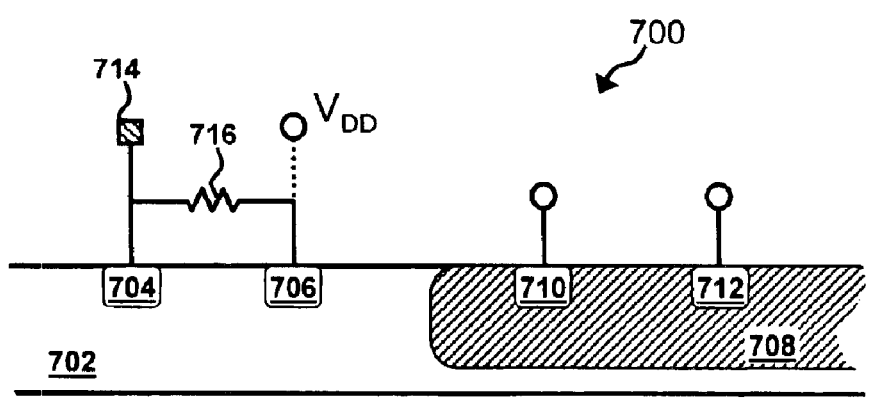
FIG. 7

VERSATILE SYSTEM FOR ELECTROSTATIC DISCHARGE PROTECTION UTILIZING SILICON CONTROLLED RECTIFIER

TECHNICAL FIELD OF THE INVENTION

The present invention relates generally to the field of semiconductor devices and, more particularly, to apparatus and methods providing silicon controlled rectifiers for electrostatic discharge protection.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, the properties and behaviors of semiconductor structures and materials.

For some time now, the phenomenon of electrostatic discharge (ESD) has created a number of problems for manufacturers and end-users of semiconductor technology. ESD may be defined as the transfer of charge between bodies at different electrical potentials. The magnitude of such differing potentials is expressed as a voltage. ESD voltages can vary across a wide range of extreme voltages (e.g., ~100 V–30000 V), depending upon a number of variables.

Occurrences of ESD—sometimes referred to as "ESD events"—can be caused by any number of routine procedures or happenings, commonly requiring only contact and separation of two materials. ESD events include electrostatic discharges to and from a device, as well as field induction discharges. Given their relatively large magnitude, and the relative ease with which they occur, efforts to minimize ESD events have been made for some time now.

Even so, as semiconductor device structures and geometries are reduced, their sensitivity and susceptibility to ESD events increases. ESD events can drastically alter or damage the electrical characteristics of a semiconductor device—degrading or destroying it. Damage caused by ESD can be catastrophic (and immediate) or latent in nature. Latent defects can result in a number of reliability and repair problems in end equipment use. Whether ESD-induced damage is immediate or latent in nature, a damaged device is usually scrapped or replaced. Thus, even where ESD events occur only infrequently, losses can—over time—be substantial.

In addition to efforts made to reduce the occurrence of ESD events, efforts have also been made to mitigate the physical damage caused by ESD. Among semiconductor manufacturers, such efforts have included the utilization of circuitry components that are inherently capable of withstanding or dissipating ESD discharges without being damaged. One such structure that is frequently utilized is the silicon-controlled rectifier (SCR).

SCRs may be implemented in a number of ways. In a CMOS-based technology, for example, an SCR structure may comprise a P-N-P-N junction. The performance characteristics of most SCRs, however, are generally similar—especially with regards to ESD protection. Most SCRs are designed such that they are capable of dissipating a high level of voltage at relatively low current. Once the voltage (and current) discharged reaches a certain level (i.e., a voltage threshold), the SCR transitions into a low voltage hold state. This hold state is at a voltage level lower than the device's normal operating voltage. As the ESD event occurs, the SCR structure remains in the hold state until the ESD discharge dissipates. Most ESD events are temporally short, and usually occur—in a semiconductor manufacturing environment—when the device itself is powered off.

Unfortunately, however, many conventional SCR structures can experience latch-up problems during normal operation of the device in which the SCR is implemented. In a number of integrated circuits (ICs), the operational voltage range of a device is well below the hold-state voltage threshold of the SCR structure. Even where operational anomalies—such as electrical signal noise or stresses—are present, operational voltages do not exceed the hold-state voltage threshold. In a growing number of applications (e.g., power ICs, etc.), however, device operational voltages are significant, and well within a nominal range of the hold-state voltage threshold. Thus, minor signal noise or electrical stress can push the device past the threshold and into a hold-state latch-up. This can cause the device to latch up, negatively impacting device and system performance.

As a result, there is a need for a versatile system that readily provides SCR-based ESD protection, while obviating operational latch-up problems, for IC designs in an easy, efficient and cost-effective manner.

SUMMARY OF THE INVENTION

The present invention provides a versatile system for electrostatic discharge protection utilizing SCR structures. The present invention provides SCR structures enhanced with clamping or switching constructs to alter SCR electrical behavior during normal device operation. The SCR structures of the present invention are thus provided with resistance to operational latch-up and, in some embodiments, with de-latching characteristics. The present invention provides these structures and constructs in versatile embodiments that are readily implemented in a wide variety of semiconductor fabrication processes. The structures and constructs provided by the present invention thereby minimize or eliminate SCR operational latch-up problems in an easy, efficient and cost-effective manner—overcoming limitations of conventional systems.

More specifically, the present invention provides a system for electrostatic discharge protection in a semiconductor device, utilizing a silicon-controlled rectifier. The system includes the silicon controlled rectifier, which has: a first p-type region coupled to a voltage node; a first n-type region having a first side adjoining the first p-type region; a second p-type region having a first side adjoining a second side of the first n-type region; and a second n-type region having a first side adjoining a second side of the second p-type region. A clamping structure is intercoupled between the second n-type region and ground. This structure prevents the junction between the second p-type region and the second n-type region from retaining a forward bias. A switching structure is intercoupled between the second p-type region and ground. This structure grounds the second p-type region during normal operation of the semiconductor device.

The present invention also provides semiconductor device having a voltage node coupled to a first p-type region. A first n-type region has a first side adjoining the first p-type region. A second p-type region has a first side adjoining a second side of the first n-type region. A second n-type region has a first side adjoining a second side of the second p-type region. A clamping circuit is intercoupled between the second n-type region and ground. The device also includes a switching circuit intercoupled between the second p-type region and ground.

The present invention further provides a method of providing a semiconductor device utilizing a silicon-controlled rectifier. The method involves providing a semiconductor device having a silicon-controlled rectifier formed therein. A clamping structure is provided, coupled to the silicon-controlled rectifier, and adapted to prevent a p-n junction within the silicon-controlled rectifier from retaining a forward bias. A switching structure is coupled to the p-type portion of the p-n junction, and adapted to ground the p-type portion during normal operation of the semiconductor device.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which:

FIG. 4 is a schematic depicting an illustrative implementation of a PRIOR ART SCR system;

FIG. 5 illustrates one embodiment of an SCR system according to the present invention;

FIG. 7 illustrates one embodiment of a device implementing an SCR structure in accordance with the present invention.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The invention will now be described in conjunction with the manufacture of semiconductor devices utilizing silicon-controlled rectifiers (SCRs) to provide electrostatic discharge (ESD) protection. The specific embodiments discussed herein are merely illustrative of specific ways to make and use the invention and do not limit the scope of the invention.

The present invention provides a versatile system for electrostatic discharge protection utilizing SCR structures. SCR structures, according to the present invention, are provided with clamping or switching constructs. These constructs alter the behavioral characteristics of an SCR structure during normal device operation. The SCR structures of the present invention are thus provided with resistance to operational latch-up and, in some embodiments, with de-latching characteristics. These structures and constructs are provided in versatile embodiments that are readily implemented in a wide variety of semiconductor fabrication processes. The present invention thereby minimizes or eliminates SCR operational latch-up problems in an easy, efficient and cost-effective manner.

Figure 1:
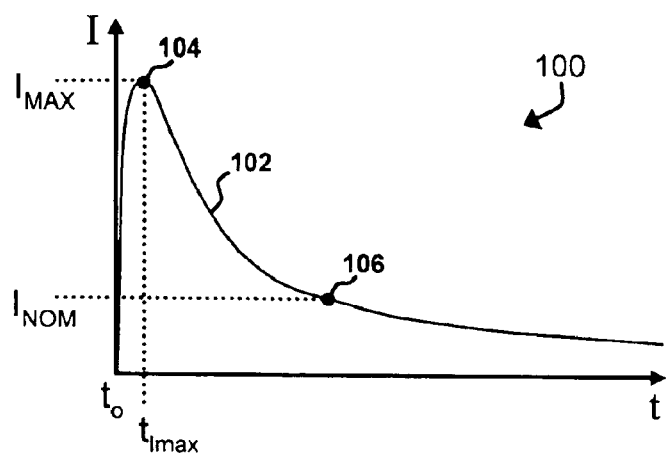
FIG. 1 is a depiction of an illustrative current versus time plot of a sample ESD event.

As previously noted, ESD events and their resultant effects create a number of problems for manufacturers and end-users of semiconductor technology. Although ESD events are, generally, relatively high voltage, they are usually temporally very short and characterized by relatively manageable current levels. This is illustrated now by FIG. 1, which depicts a current vs. time plot 100. Plot 100 depicts a current v. time curve for sample ESD event. Starting at time $t_{(0)}$, an ESD pulse 102 increases very quickly until reaching its maximum current level 104, at time $t_{(Imax)}$. The ESD pulse then decreases somewhat gradually until dropping below some nominal current level 106. A number of factors can affect the rate at which the pulse decreases. In most semiconductor manufacturing and test occurrences, the ESD event happens to a device in power down state—thus the ESD current may be dissipated relatively quickly.

SCRs are utilized to provide sensitive circuitry with protection from ESD events. For example, an SCR may be provided in parallel to a particular circuit requiring protection. During normal operation, the SCR is adapted to behave like an open circuit—leaving the performance of the protected circuit unaffected. During an ESD event, however, the SCR is adapted to close and pass the ESD discharge—shunting the discharge away from the protected circuit.

Figure 2:
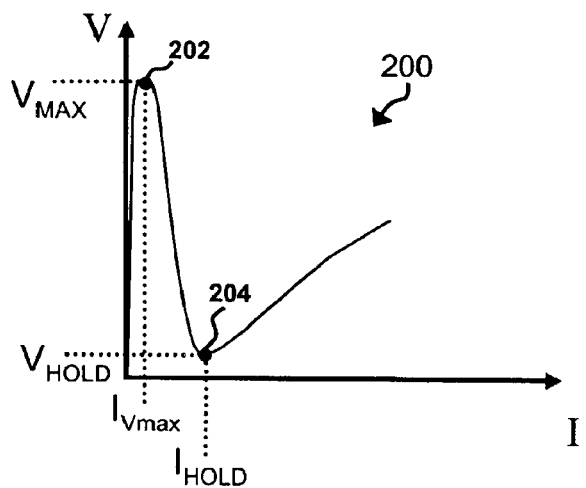
FIG. 2 is a depiction of an illustrative current versus voltage plot for a sample SCR device.

For purposes of explanation and illustration, FIG. 2 depicts a plot 200 that represents a sample current vs. voltage plot for an SCR. As illustrated by plot 200, an SCR is capable of discharging a large amount of voltage at a low current level. As current begins to build, a maximum voltage 202 ($V_{MAX}$) is reached. The current level at this point is $I_{(VMAX)}$. As current continues to build, the SCR quickly slips into a hold state 204. Thus, voltage 202 may be referred to as the hold state threshold. The voltage level at state 204 is $V_{HOLD}$, and the current is $I_{HOLD}$. Thereafter, the voltage level increases very slowly in relation to the rate of increase in current.

The SCR is thus capable of remaining at the relatively low HOLD state voltage, even in the presence of relatively high current levels. This characteristic illustrates the usefulness of SCRs in handling ESD events of the type illustrated in FIG. 1. Typically, ESD events occur—at least within semiconductor manufacturing and test environments—when devices are powered off. Thus, the SCR does not remain in the hold state once the ESD charge has been dissipated.

Figure 3:
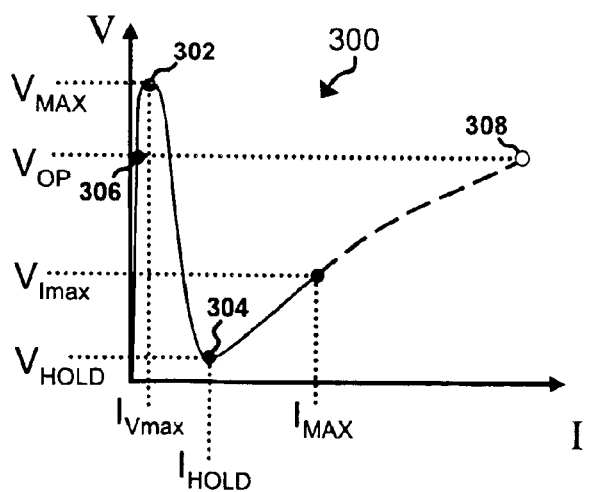
FIG. 3 is a depiction of a current versus voltage plot for a PRIOR ART SCR system.

Unfortunately, this useful, low hold-state voltage characteristic can present certain operational problems in a number of relatively high voltage applications. Referring now to FIG. 3, plot 300 replicates plot 200 for the purposes of illustrating and explaining such problems encountered with conventional SCR systems. Plot 3 represents a sample current vs. voltage plot for a conventional (Prior Art) SCR system. As illustrated by plot 300, the SCR is capable of discharging a large amount of voltage at a low current level. As current begins to build, a maximum voltage 302 ($V_{MAX}$) is reached. The current level at this point is $I_{(VMAX)}$. As current continues to build, the SCR quickly slips into a hold state 304. The voltage level at state 304 is $V_{HOLD}$, and the current is $I_{HOLD}$. Thereafter, the voltage level increases very slowly in relation to the rate of increase in current. The conventional SCR circuitry may only be capable of a certain maximum current $I_{MAX}$ (e.g., 1.5 A), which corresponds to a voltage $V_{(IMAX)}$ that is very close to $V_{HOLD}$. The system in which the SCR is utilized, however, may require an operational voltage ($V_{OP}$) that is relatively close to $V_{MAX}$.

Operation where $V_{OP}$ is reached before the SCR transitions into hold state is represented by point 306. In this mode, because $V_{OP}$ is so close to $V_{MAX}$, signal anomalies (e.g., voltage noise or rapid voltage ramp-ups) may provide enough voltage/current to push the SCR into hold state. Once the SCR reaches hold state, operation at $V_{OP}$ requires a current level, represented by point 308, far in excess of $I_{MAX}$—which the system simply cannot supply or dissipate. Thus, the system essentially remains "latched up" at or around $V_{HOLD}$. The system might be "reset" by powering down, but such a remedy is not practical in most applications. Thus, the same characteristic that makes the SCR useful for ESD protection also renders it problematic in systems utilizing relatively high operational voltages.

Unfortunately, most conventional SCR circuitry systems appear to leave this issue un-addressed. A representative schematic 400 of a conventional (Prior Art) SCR implementation is illustrated now with reference to FIG. 4. Schematic 400 depicts an SCR structure 402, implemented as ESD protection in some portion of a device's circuitry. Structure 402 is disposed between some voltage node 404 and ground 406. Structure 402 comprises P-type portions 408 and 410, and N-type portions 412 and 414. Some resistance 416 is intercoupled between portion 412 and node 404, and a resistance 418 is intercoupled between portion 410 and ground 406. SCR implementations of this type offer little, if any, protection against operational latch up problems of the type previously described. Furthermore, as previously illustrated, such schemes provide no practical means for bringing a circuit out of latch up once it has occurred.

Thus, with conventional SCR ESD protection schemes, the SCR structures and implementations do not provide any operational differentiation between ESD events and normal system operation. This can result in latch up problems during normal operation. Once a conventional SCR structure latches up, the system must either be reset—which is impractical and inefficient—or face the likelihood of system damage or reliability problems (e.g., SCR burn-out, battery drainage, etc.).

In contrast, an SCR system 500 according to the present invention is illustrated now with reference to FIG. 5. System 500 comprises an SCR structure 502, providing ESD protection in some portion of a device's circuitry. Structure 502 is disposed between some voltage node 504 (e.g., a bond pad) and a clamping circuit 506. Structure 502 comprises P-type portions 508 and 510, and N-type portions 512 and 514. Some resistive element 516 is intercoupled between portion 512 and node 504. A switching circuit 518 is intercoupled between portion 510 and ground 520. The clamping circuit 506 is intercoupled between structure 502 and ground 520.

Within system 500, resistive element 516 may be a resistor or, alternatively, may be replaced by some other shunting circuitry in accordance with the present invention. Alternatively, resistance 516 may be omitted altogether. SCR 502 is stacked above a low holding voltage clamp circuit 506. Clamp circuit 506 is provided to prevent the bottom junction of SCR 502 from staying forward-biased when circuit 506 is on. This clamping circuit may comprise any number of circuits designed to conduct the entire ESD current in accordance with the present invention. In certain embodiments, for example, circuit 506 may comprise an NPN transistor operating in BVECR mode (Breakdown Voltage; Emitter/Collector nodes; Resistor on base). In other embodiments, circuit 506 may comprise an NMOS transistor operating in BVDSS mode (Breakdown Voltage; Drain/Source nodes; gate to Source). In still other embodiments, circuit 506 may comprise a simple diode (e.g., avalanche diode). These and other variations are comprehended by the present invention.

Switching structure 518 is provided to effectively turn off SCR 502 during normal operation, by grounding portion 510. In one embodiment, for example, structure 518 may comprise an NMOS transistor disposed to shunt portion 510 to ground. The gate of such a transistor is coupled to some bias voltage (e.g., a $V_{DD}$ bias voltage), having the effect of grounding portion 510. During normal operation, SCR 502 is effectively turned off. When the device is powered off, however, $V_{DD}$ is left floating. If an ESD event between node 504 and ground 520 occurs, SCR 502 turns on, since $V_{DD}$ is floating (and has capacitance to ground). SCR 502 then dissipates the ESD charge, protecting other circuitry in the device. In alternative embodiments, structure 518 may comprise a simple resistor, or any other suitable structure that provides the desired bias of portion 510.

Depending upon desired system performance, the relative values and performances of clamping circuit 506 and switching circuit 518 may be optimized to provide a desired result. The voltage drop across circuit 506 may be designed as any desired value. Generally speaking, however, a relatively low voltage drop across circuit 506 provides better ESD protection than a relatively high voltage drop. A relatively high voltage drop across circuit 506, however, decreases the likelihood of operational latch up problems (as illustrated hereinafter). Similarly, the on-value of switching circuit 518 may be modified to selectively alter the operational bias at portion 510 (e.g., ~5 V). The combined effects of the clamping and switching circuits on the performance of system 500 are illustrated now with reference to FIG. 6.

Figure 6:
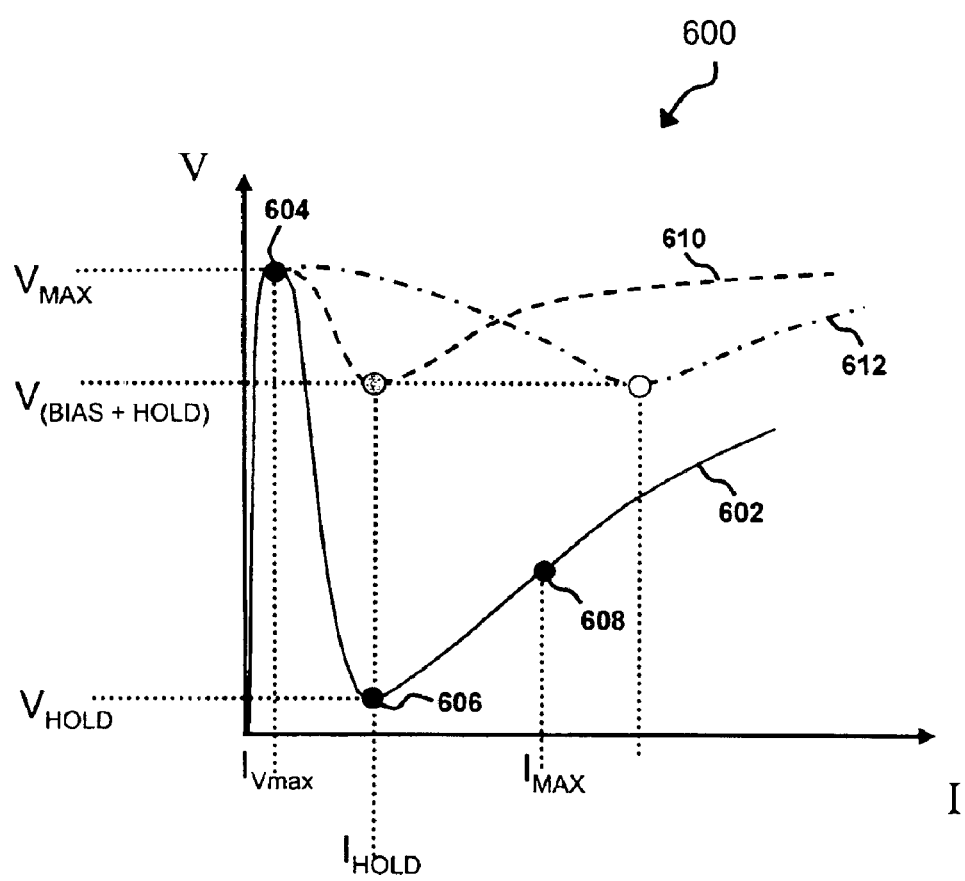
FIG. 6 depicts an illustrative current versus voltage plot for an SCR system according to the present invention.

FIG. 6 depicts a plot 600, which replicates the plot data of FIG. 2 for comparison purposes. Plot 600 illustrates the performance characteristics of an SCR system of the present invention, in contrast to those of an SCR system without benefit of the present invention. Plot line 602 represents the characteristics of plot 200 from FIG. 2. Point 604 corresponds to the maximum voltage $V_{MAX}$ (or hold state threshold voltage) of the unmodified system, occurring at current $I_{(VMAX)}$. As current continues to build, the SCR slips past the threshold into a hold state 606. The voltage level at state 606 is $V_{HOLD}$, and the current is $I_{HOLD}$. Point 608 depicts the maximum current $I_{MAX}$ that the circuitry is capable of.

Plot line 610 represents the modification of the SCR system by addition of a switching circuit. The addition of the switching circuitry has the effect of shifting the on-state hold voltage value by some amount corresponding to the bias voltage of the switching circuit ($V_{BIAS+HOLD}$). The off-state hold voltage, however, remains at the original $V_{HOLD}$ value—retaining the beneficial ESD protection of the SCR structure. Plot line 612 represents the modification of the SCR system by addition of a clamping circuit. The addition of the clamping circuitry has the effect of shifting the on-state hold current value ($I_{CLAMP}$) by an amount correlating to the effective resistance of the clamping circuitry. In many cases, $I_{CLAMP}$ may be effectively shifted beyond $I_{MAX}$. This renders the system, during on-state operation, incapable of sourcing enough current enter the holds state—effectively preventing operational latch up. Again, this effect has very little impact on the off-state ESD protection afforded by system 500.

Another aspect of the present invention is illustrated now in reference to FIG. 7, which depicts a schematic portion 700 of a device implementing an SCR structure according to the present invention. Portion 700 comprises an N-well 702, having a P-type region 704 and an N-type region 706, and a P-well 708, having its own N-type region 710 and a P-type region 712. The adjoinment of N-well 702, regions 704 and 706, P-well 708, and region 710—more specifically, the junctions between these areas—form an SCR structure similar to SCR 502, as illustrated in FIG. 5. Portion 700 further comprises a pad structure 714 coupled directly to region 704. Pad structure 714 is similar to node 504 of FIG. 5. A resistance 716 couples region 706 to pad 714, similar to resistance 516. In one alternative embodiment, resistance 716 is decoupled from region 706. Region 706 is instead coupled directly to a voltage source such as $V_{DD}$ (718). This embodiment provides for a voltage at pad 714 greater than $V_{DD}$ (e.g., no forward-biased diode to $V_{DD}$).

In all embodiments of the present invention, the constituent functions and components may be implemented in a wide variety of ways—comprising individual and integrated device constructs of varying values and configurations. Though certain aspects and embodiments have been illustrated and explained with reference to particular fabrication technologies (e.g., CMOS), it should be understood that the present may be similarly applied to other processing technologies (e.g., bipolar, hybrids). Further modifications or alterations may be made to components as disclosed in accordance with the present invention. All such variations and alternative combinations are comprehended by the present invention, and all such embodiments may be employed to provide the benefits of the present invention.

Thus, the embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. As indicated, many modifications and variations are possible in light of the above teaching without departing from the spirit and scope of the following claims.

What is claimed is:

1. A semiconductor device comprising:
   a voltage node coupled to a first p-type region;
   a first n-type region having a first side adjoining the first p-type region;
   a second p-type region having a first side adjoining a second side of the first n-type region;
   a second n-type region having a first side adjoining a second side of the second p-type region;
   a clamping circuit intercoupled between the second n-type region and ground; and
   a switching circuit intercoupled between the second p-type region and ground.

2. The device of claim 1, further comprising a resistive element intercoupled between the first n-type region and the voltage node.

3. The device of claim 2, wherein the resistive element comprises a resistor.

4. The device of claim 1, wherein the voltage node comprises a bond pad.

5. The device of claim 1, wherein the switching circuit comprises a resistor.

6. The device of claim 1, wherein the switching circuit comprises a transistor.

7. The device of claim 6, wherein the transistor comprises an NPN transistor.

8. The device of claim 6, wherein the transistor comprises an NMOS transistor.

9. The device of claim 1, wherein the clamping circuit comprises a transistor.

10. The device of claim 9, wherein the transistor comprises an NPN transistor.

11. The device of claim 9, wherein the transistor comprises an NMOS transistor.

12. The device of claim 1, wherein the clamping circuit comprises a diode.

13. A system for providing a electrostatic discharge protection in a semiconductor device, utilizing a silicon controlled rectifier, the system comprising:
   a silicon controlled rectifier having a first p-type region coupled to a voltage node, a first n-type region having a first side adjoining the first p-type region, a second p-type region having a first side adjoining a second side of the first n-type region, and a second n-type region having a first side adjoining a second side of the second p-type region;
   a clamping structure, intercoupled between the second n-type region and ground, and adapted to prevent the junction between the second p-type region and the second n-type region from retaining a forward bias; and
   a switching structure, intercoupled between the second p-type region and ground, and adapted to ground the second p-type region during normal operation of the semiconductor device.

* * * * *